(12) United States Patent
Mori

(10) Patent No.: US 7,092,291 B2
(45) Date of Patent: Aug. 15, 2006

(54) NONVOLATILE SEMICONDUCTOR MEMORY DEVICE, CHARGE INJECTION METHOD THEREOF AND ELECTRONIC APPARATUS

(75) Inventor: Hideki Mori, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 11/061,623

(22) Filed: Feb. 22, 2005

(65) Prior Publication Data

US 2005/0194633 A1    Sep. 8, 2005

(30) Foreign Application Priority Data

Mar. 4, 2004    (JP) .............................. 2004-061269

(51) Int. Cl.
 *G11C 11/34* (2006.01)
 *G11C 16/04* (2006.01)
(52) U.S. Cl. .......................... 365/185.18; 365/185.24; 365/185.26; 365/185.27; 365/189.09
(58) Field of Classification Search ........... 365/185.18, 365/185.24, 185.26, 185.27, 185.29, 185.33, 365/189.09
See application file for complete search history.

(56) References Cited

U.S. PATENT DOCUMENTS 5,999,444 A * 12/1999 Fujiwara et al. ....... 365/185.02

6,301,155 B1 * 10/2001 Fujiwara ................. 365/185.18
6,570,788 B1 * 5/2003 Nakamura ............. 365/185.18

FOREIGN PATENT DOCUMENTS

JP    2001-102553    4/2001

* cited by examiner

*Primary Examiner*—Richard Elms
*Assistant Examiner*—Toan Le
(74) *Attorney, Agent, or Firm*—Rader, Fishman & Grauer PLLC; Ronald P. Kananen

(57) ABSTRACT

A charge injection method for improving the efficiency of generating hot carriers, wherein, for example, electrons are injected at writing and holes are injected at erasing to a charge storage layer of a memory transistor. A positive voltage is applied to the drain region by using a voltage of the source region as a reference, and a voltage having a polarity in accordance with charges to be injected is applied to a gate electrode. A voltage having a voltage value between a source voltage and a drain voltage for turning on a diode made by an N-type source region and a P-type body region is applied to the body region. Then a parasitic bipolar transistor turns on, and, consequently, impact ionization arises on the drain side and an injection charge amount increases.

9 Claims, 5 Drawing Sheets

WRITING

WRITING

ERASING

WRITING

ERASING

NONVOLATILE SEMICONDUCTOR MEMORY DEVICE, CHARGE INJECTION METHOD THEREOF AND ELECTRONIC APPARATUS

BACKGROUND OF THE INVENTION

1. Field of the Invention

The present invention relates to a charge injection method of a nonvolatile semiconductor memory device (flash EEPROM) by applying different voltages to a source region and a drain region, a nonvolatile semiconductor memory and an electronic apparatus incorporating the same.

2. Description of the Related Art

A flash EEPROM as a kind of nonvolatile memory stores data in accordance with a charge storage state of a charge storage layer. As a flash EEPROM, there is a device having a gate structure wherein charges accumulated in a charge storage layer are made by conductive polysilicon (FG type) and having a gate structure wherein conductivity of the charge storage layer is extremely low as in a typical MONOS (metal-oxide-nitride-oxide-semiconductor) type. In the FG type, electrons are injected, for example, from a whole surface of a channel to tunnel through the gate oxide film, so that the electrons are accumulated in the charge storage layer (FG: floating gate) provided on the gate oxide film (for example, refer to The Japanese Unexamined Patent Publication No. 1999-86570: the patent article 1).

In the charge injection method described in the patent article 1, a high voltage of 18 V or so is applied to a gate electrode while impurity diffusion regions as a source and a drain are in a floating state. At this time, because of the configuration of the memory cell array, 0V is applied to a well where a channel of selected memory transistor is formed, and a negative voltage (−1 to −2V) is applied to a well of a non-selected memory transistor wherein the gate is applied with 18V to prevent erroneous charge injection.

In the case of mounting a nonvolatile memory together with a logic area formed by a MOS or BiCMOS process on the same chip (hereinafter, referred to as logic embedded memory), particularly in the case of the FG type, an additional layer of polysilicon is required as a charge storage layer, so that the logic area and a memory area are largely different in the gate structure, a photomask is specially required for forming a nonvolatile memory, and the number of procedure steps widely increases. Furthermore, it is hard for the FG type to attain a low voltage due to the reason that the gate oxide film (tunnel oxide film) cannot be made very thin or a coupling capacitance of the gate and the channel is large, etc.

On the other hand, in the case of applying the MONOS-type gate structure to the logic embedded memory, since the charge storage layer of the MONOS transistor is configured by a nitride film sandwiched by oxide films, the number of polysilicon layers of the memory area can be made the same as that of the logic area, the logic area and the memory area are relatively highly in common in terms of the gate structure, and the number of photomasks and the number of procedure steps are increased only a little.

However, in the case of the flash EEPROM, when a writing voltage and an erasing voltage of data are high, a high withstand voltage MOS transistor is required for a built-in voltage generation circuit. This point is a common problem of the FG type and the MONOS type. Thus, also in the MONOS type, when realizing embedding of a logic circuit in a nonvolatile memory, an increase of the number of photomasks and the number of procedure steps is inevitable. Accordingly, particularly in LSI, etc. wherein a logic circuit is embedded in a nonvolatile memory, lowering of the writing voltage and erasing voltage is pursued to suppress an increase of the number of photomasks and the number of procedure steps as much as possible, so that a high withstand voltage transistor becomes unnecessary (for example, refer to The Japanese Unexamined Patent Publication No. 2001-102553: the patent article 2).

In the charge injection method described in the patent article 2, the writing voltage and the erasing voltage are separated to have different polarities and given to the gate and well, and the well is applied with a positive or a negative voltage. In the charge injection method, in the same way as in the patent article 1, charges are injected from the whole surface of the channel to the charge storage layer while the source region and the drain region are held at the same potential.

Since a MONOS transistor has a charge storage layer with an extremely low conductivity, a local charge injection is possible. As a suitable charge injection method thereto, a so-called-channel-hot electron (CHE) injection method is known.

FIG. 5A is an explanatory view of an operation of injecting CHE.

As shown in FIG. 5A, a stacked insulation film 101 composed of an oxide film 101A, a nitride film 101B as a charge storage layer and an oxide film 101C is formed on a body region (a part of a substrate or a well) 100 made by a P-type semiconductor, and a gate electrode 102 is formed thereon. Two N-type LDD (lightly-doped drain) regions 103s and 103d are formed by partially overlapping with the gate electrode 102 at positions being distant from each other in the body region 100. On both sidewalls of the gate electrode 102 are formed with spacers 104s and 104d made of an insulator. On a portion of the surface side of the body region 100, a position of which is set by the spacer 104s, a source region 105s made by an N-type impurity region is formed. In the same way, on a portion of the surface side of the body region 100, a position of which is set by the spacer 104d, a drain region 105d made by an N-type impurity region is formed.

The source region 105s, the drain region 105d, the gate electrode 102 and the body region 100 can be applied with respectively suitable voltages Vs, Vd, Vg and Vb via not shown contact portions and wirings.

In a MONOS transistor configured as above, a nitride film 101B as a charge accumulation film has a particularly high charge trap density near boundary surfaces with upper and lower oxide films 101A and 101C. A threshold voltage of the MONOS transistor changes between the state where electrons are injected and then trapped in the charge traps and the state where the electrons are erased. Therefore, changes of the threshold voltage are related to the binary code of data, and data can be stored in the MONOS transistor.

When defining that an operation of injecting electrons is a writing operation, a voltage Vs of the source region 105s is set to be a ground voltage GND (=0V) and, based thereon, a positive voltage Vd (+) is applied to the drain region 105d and a positive voltage Vg (+) is applied to the gate electrode 102 in the writing operation. At this time, the body region 100 is held at the same ground voltage GND as that of the source region 105s.

Under this bias condition, electrons supplied from the source region 105s to the channel CH flow toward the drain region 105d and are accelerated by an electric field of lateral direction at the same time. Then, high energy electrons (hot electrons) are generated near an end portion of the drain side LDD region 103d, where the electric field is the strongest, and a part thereof goes over an energy barrier made by the oxide film 101A, etc., is shot into the stacked insulation film 101, and captured by charge traps in a region around the drain end portion of the nitride film 101B.

A threshold voltage after the writing becomes higher than that before writing due to mutual canceling of electrons trapped in the stacked insulation film 101 and a positive voltage applied to the gate electrode 102 at reading.

Erasing of data can be attained by making the charge amount of the captured electrons zero or sufficiently small. Other than a method of drawing out electrons by an electric field, there is a method of electrically canceling with electrons by injecting charges having an inverse polarity (holes). FIG. 5B is a view of an example of an erase operation by injecting holes.

In this case, in the same way as in the case of writing explained above, the source region 105s and the body region 100 are held at the ground potential GND and the drain region 105d is applied with a predetermined positive voltage Vd (+). Note that the gate electrode 102 is applied with a negative voltage Vg (−), which is an inverse polarity from that at writing.

At this time, a channel is not formed because the gate voltage Vg (−) is negative, and the drain voltage Vd (+) is applied to the drain region 105d and the LDD region 103d. As a result, a hole accumulation layer is formed at the surface portion of the LDD region 103d around a lower region of the gate electrode 102 affected by the negative voltage application, the holes drift in the electric field of lateral direction while being accelerated by an electric field of vertical direction to become high energy charges (HH: hot holes), go over an energy barrier made by the oxide film 101A, etc., are shot into the stacked insulation film 101, and enter into an electron holding region around the drain end portion of the nitride film 101B. Electrons captured at the time of writing recombine with the holes to be injected at erasing, so that a threshold voltage of the MONOS transistor returns back to the value before the writing operation.

This method of writing and erasing data by applying different voltages to a source region and a drain region is not limited to the MONOS type but can be also applied to the FG type.

However, on a background of a demand for logic embedded memory of a flash EEPROM, a still lower voltage has to be attained to suppress an increase of the number of photomasks and the number of procedure steps as much as possible. In this case, the above-explained charge injection method of applying different voltages to a source region and a drain region, as in the CHE injection and the HH injection, has a disadvantage of bringing a decline of the efficiency of generating hot carriers due to the low operation voltage, and a writing time and an erasing time become long.

SUMMARY OF THE INVENTION

An object of the present invention is to improve a hot-carrier generation efficiency even when an operation voltage is low in a charge injection method of applying different voltages to a source region and a drain region.

According to the present invention, there is provided a charge injection method of a nonvolatile semiconductor memory device, for changing a data storage status by injecting charges to a charge storage layer of a memory transistor comprising a body region of a first conductive type formed in a semiconductor substrate or formed as a semiconductor layer supported by a base body, a source region and a drain region made by a second conductive type semiconductor regions formed to be distant from each other in the body region, a stacked insulation film formed on the body region and including a charge storage layer, and a gate electrode formed on the stacked insulation film for controlling electric fields of the charge storage layer and the body region. The method comprises the steps of, when injecting the charges; applying different voltages to the source region and the drain region; applying a voltage (body bias voltage) between the different voltages respectively applied to the source region and the drain region for turning on a diode formed by the source region of a second conductive type and the body region of a first conductive type to the body region; and applying a voltage having a polarity in accordance with charges to be injected to the gate electrode.

Specifically, when injecting holes to the charge storage layer, by using one of the source region and the drain region as a reference, a positive voltage is applied to the other, a lower positive voltage than the positive voltage is applied to the body region, and a negative voltage is applied to the gate electrode.

Alternately, when injecting electrons to the charge storage layer, by using one of the source region and the drain region as a reference, a positive voltage is applied to the other, a lower positive voltage than the positive voltage is applied to the body region, and a positive voltage is applied to the gate electrode.

According to the present invention, there is provided a nonvolatile semiconductor memory device, comprising a memory transistor provided with a body region of a first conductive type formed in a semiconductor substrate or formed as a semiconductor layer supported by a base body, a source region and a drain region made by second conductive type semiconductor regions formed to be distant from each other in the body region, a stacked insulation film formed on the body region and including a charge storage layer, and a gate electrode formed on the stacked insulation film for controlling electric fields of the charge storage layer and the body region. The nonvolatile semiconductor memory device has a periphery circuit for controlling a data storing operation of the memory transistor by changing a charge storage state of the charge storage layer. Among voltages generated by the periphery circuit, different voltages are applied to the source region and the drain region, and a voltage (body bias voltage) supplied to the body region when injecting charges to the charge storage layer by applying a gate voltage to the gate electrode is set to a voltage between a source voltage to be supplied to the source region and a drain voltage to be supplied to the drain region for turning on a diode formed by the source region of a second conductive type and the body region of a first conductive type.

In the nonvolatile semiconductor memory device, preferably, a plane shape of a surface side portion of the body is set, so that a current path flowing in the body region when different voltages are supplied to the source region and the drain region becomes narrow on the drain region side.

According to the present invention, there is provided an electronic apparatus mounted with a nonvolatile semiconductor memory device, wherein the nonvolatile memory device comprises a body region of a first conductive type formed in a semiconductor substrate or formed as a semiconductor layer supported by a base body; a source region and a drain region made by second conductive type semiconductor regions formed to be distant from each other in the body region; a stacked insulation film formed on the body region and including a charge storage layer; and a gate electrode formed on the stacked insulation film for controlling electric fields of the charge storage layer and the body region. The nonvolatile memory device comprises a voltage supply circuit for generating voltages to be applied respectively to the body region, the source region, the drain region and the gate electrode, and supplying these generated voltages to the nonvolatile semiconductor memory device when injecting charges to the charge storage layer is provided in the electronic apparatus. A voltage supplied to be the body region (body bias voltage) is set to a voltage between a source voltage to be supplied to the source region and a drain voltage to be supplied to the drain region for turning on a diode formed by the source region of a second conductive type and the body region of a first conductive type.

According to the nonvolatile semiconductor memory device and the charge injection method of the present invention, a source region is a first conductive type and a body region is a second conductive type, and both are contacted. Also, another portion of the second conductive type body region contacts a first conductive type drain region. At the time of charge injection, the source region and the drain region are held at respectively different voltages, and a body bias voltage between the two is applied to the body region. At this time, the body bias voltage is at a voltage value in a range of turning on a diode formed at a contact portion of the source region and the body region (PN junction). Therefore, for example, when the memory transistor is an N-channel type, that is, when the source region and the drain region are N-type and the body region is a P-type, an NPN-type parasitic bipolar transistor, wherein the source region is an emitter, the body region is a base and the drain region is a connector, operates. As a result, current flows in the body region, but when the respective voltages are suitably set, pairs of electrons and holes are generated near the drain region due to the current. Among the pairs of electrons and holes, charges having an inverse polarity from a voltage applied to the gate electrode are drawn to the gate electrode to obtain high energy, injected into the stacked insulation film and trapped in the charge storage layer.

Therefore, other than charges injected to the charge storage layer the same as in the conventional case of not applied with a body bias voltage, charges generated as a result that a bipolar transistor is turned on as explained above are injected to a stacked insulation film. Accordingly, an efficiency of injecting charges is improved, and a predetermined threshold voltage change is brought even by a low operation voltage, so that the charge injection time becomes short. Also, when assuming that the charge injection time is the same, charge injection at a lower operation voltage becomes possible.

According to the electric device according to the present invention, among various voltages for realizing charge injection capable of attaining a low voltage at high speed as explained above, a voltage supply circuit for generating a body bias voltage and supplying the same to a nonvolatile semiconductor memory device is incorporated in the electronic apparatus.

According to the electronic apparatus according to the present invention, even in the case where only a nonvolatile semiconductor memory device configured to be not provided with a function of generating a body bias voltage, as far as a terminal for supplying a voltage to the body region is provided, the charge injection method of the present invention can be applied by connecting the nonvolatile semiconductor memory device to a supply circuit of the body bias voltage incorporated in the same electronic apparatus. Consequently, it is possible to realize an electronic apparatus capable of attaining a high data rewriting speed or a low voltage operation.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, embodiments of the present invention will be explained with reference to the drawings by taking an example of a flash EEPROM having an N-channel type MONOS transistor.

Note that the present invention can be applied to memory transistors having a gate electrode configuration, except for the MONOS type. For example, the present invention can be widely applied to memory transistors having a gate configuration, such as an FG type, a so-called MNOS (metal-nitride-oxide-semiconductor) type, and a nanocrystal type wherein conductive fine particles are buried in a stacked insulation film. Also, the present invention is not limited to the N-channel type and can be applied to a P-channel type. In that case, by setting conductive types having inverse polarities to an impurity and channel and switching polarities of voltages of a source region and a drain region as will be explained below, the explanation below may be applied analogically.

Figure 2:
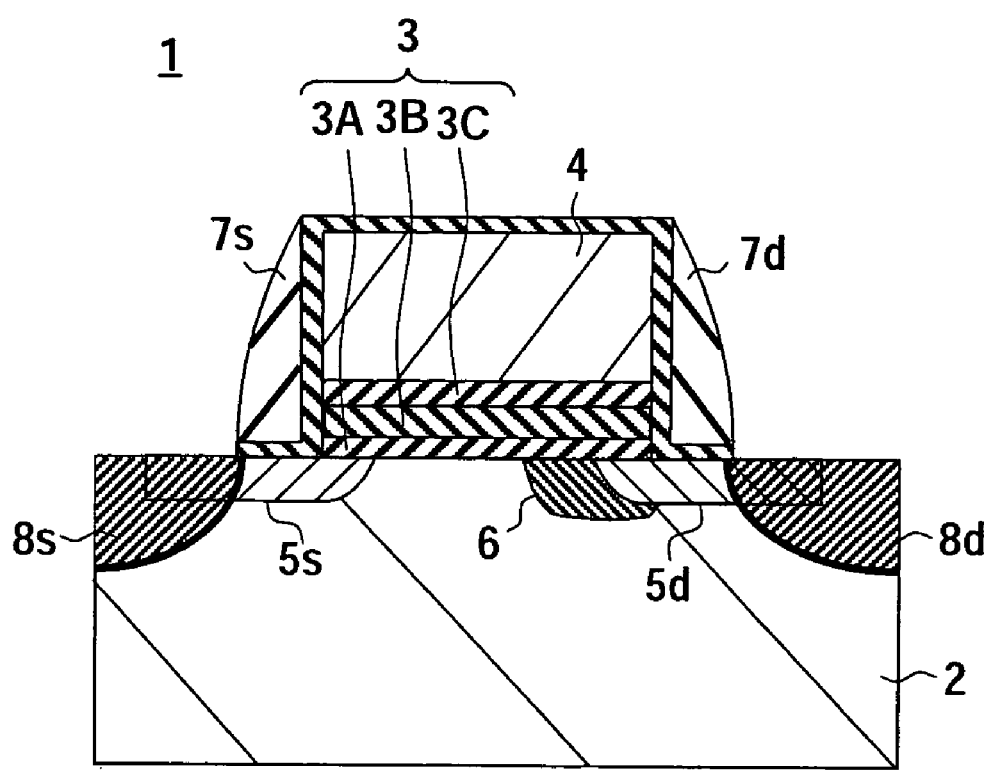
FIG. 2 is a sectional view of a MONOS transistor according to an embodiment of the present invention.

FIG. 2 is a sectional view of a MONOS transistor.

The MONOS transistor 1 shown in FIG. 2 is formed on a body region 2 made by a semiconductor having a first conductive type (P-type). Here, a form of the body region 2 may be a part of a P-type semiconductor substrate, a P-type well formed on a semiconductor substrate via another well in accordance with need, or a P-type semiconductor layer (for example, a SOI (silicon-on-insulator) layer) supported by a substrate, etc.

On a surface of the body region 2 is formed a stacked insulation film 3 composed of a first oxide film 3A, a nitride film 3B as a charge storage layer and a second oxide film 3C, and a gate electrode 4 is formed thereon.

The nitride film 3B is made by a material having a higher charge trap density than those of the first and second oxide films 3A and 3C and serves as a charge storage layer at the time of charge injection. Note that charges are captured also in the first and second oxide films 3A and 3C, but technically, the absolute amount is smaller compared with that in the nitride film 3B, so that the nitride film 3B is called a charge storage layer.

The first and second oxide films 3A and 3C electrically separate the nitride film 3B from the body region 2 or the gate electrode 4 and function to block charges inside the nitride film 3B when holding charges. If the first and second oxide films 3A and 3C have a charge trap density different from that of the nitride film 3B and function as potential barriers, they can be replaced by other films, such as an oxidized nitride film. Also, the nitride film 3B can be also replaced by a metal oxide film, etc. having a high charge trap density.

Two N-type LLD (lightly-doped drain) regions 5s and 5d partially overlapping with the gate electrode 4 are formed at positions being distant from each other in the body region 2. Also, a pocket region 6 made by a P-type impurity region is formed to be extending to the source side from near an end portion of the LDD region 5d on the drain side. The pocket region 6 is formed by injecting a P-type impurity by oblique ion injection, etc. Ion injection dose at this time is optimized, so that the P-type impurity concentration of the pocket region 6 is adjusted to be finally higher than the P-type impurity concentration of the body region exactly by a necessary amount. Due to the existence of a pocket region 6 as such, the P-type impurity concentration becomes partially high at the end portion of the LDD region 5d on the drain side, so that growth of a depletion layer is suppressed at the part at the time of applying an operation voltage, and convergence of an electric field of lateral direction is heightened, being inversely proportional to the depletion layer width. This contributes to an improvement of the charge injection efficiency, so that formation of the pocket region 6 is preferable; however, it can be also omitted, for provision of the pocket region 6 is not essential in the present invention.

On both sidewalls of the gate electrode 4 spacers 7s and 7d made by an insulating material are formed. On a portion on the surface side of the body region 2, a position of which is set by the spacer 7s, a source region 8s made by N-type impurity region is formed. In the same way, on a portion on the surface side of the body region 2, a position of which is set by the spacer 7d, drain region 8d made by a N-type impurity region is formed.

The source region 8s and the drain region 8d are formed by performing ion injection of an N-type impurity at relatively high concentration and, at this time, the spacers 7s and 7d and the gate electrode 4 serve as a self-aligning mask layer and positions of the source region 8s and the drain region 8d are determined. Also, the LDD regions 5s and 5d are formed by performing ion injection of an N-type impurity before forming the spacers 7s and 7d, and the concentration is normally set lower than those of the source region 8s and the drain region 8d. Furthermore, the LDD regions 5s and 5d respectively overlap with an end portion of the gate electrode 4 in those plane patterns. This is to make the electric field of the gate easily reaches the drain and enable generation of holes with a low drain voltage at the time of injecting holes, which will be explained later on.

Note that it is sufficient if the LDD region 5d extends directly under the gate electrode end portion from the drain region 8d, so that the electric field of the gate easily reaches the drain. In this point, it is sometimes referred to as "an extension region", which does not suggest a degree of concentration. In this case, an N-type impurity concentration of the extension region does not always have to be lower than that of the drain region 8d.

The respective source region 8s, drain region 8d, gate electrode 4 and body region 2 can be applied with voltages Vs (source voltage), Vd (drain voltage), Vg (gate voltage) and Vb (body bias voltage) suitable to the respective operations via not shown contact portions and wirings.

A large number of MONOS transistors having the above configuration are arranged in matrix to configure a memory cell array of the nonvolatile semiconductor memory device.

In each of the MONOS transistors, the nitride film 3B as a charge storage layer particularly has high charge trap density near boundary surfaces with the lower first and upper second oxide films 3A and 3C. A threshold voltage of the MONOS transistor changes between a state where electrons are injected and trapped in the charge traps and a state where the captured electrons are erased. Thus, changes of the threshold voltage are related to binary codes of data, and the data can be stored in the MONOS transistor. Note that since reading of binary or multi-value stored data is possible when a relative change of the threshold is detected, it is a matter of definition as to which state is set as a writing state and which state is set as an erasing state.

The present embodiment is to operate a parasitic bipolar transistor, wherein the source region 8s is made to be an emitter, the drain region 8d is made to be a collector and the body region 2 is made to be a base by setting voltages at the time of charge injection.

In the present embodiment, charge injection using the bipolar operation is used at least in one of writing and erasing. More specifically, there are cases where (1) writing is performed by electron injection using an bipolar operation, and erasing is performed by canceling the accumulated electrons by electron hole injection using the bipolar operations (2) writing is performed by electron injection using the bipolar operation and erasing is performed by drawing out the electrons, (3) writing is performed by holes using the bipolar operation and erasing is performed by canceling the accumulated holes by performing electron injection using the bipolar operation, and (4) writing is performed by electron hole injection using the bipolar operation and erasing is performed by drawing out the holes. Also, erasing may be any of collective erasing of a memory cell array wherein memory transistors are arranged in matrix, erasing in unit of a block or a memory cell line when the memory cell array is configured by a plurality of blocks, and erasing in unit of a bit.

Figure 1A:
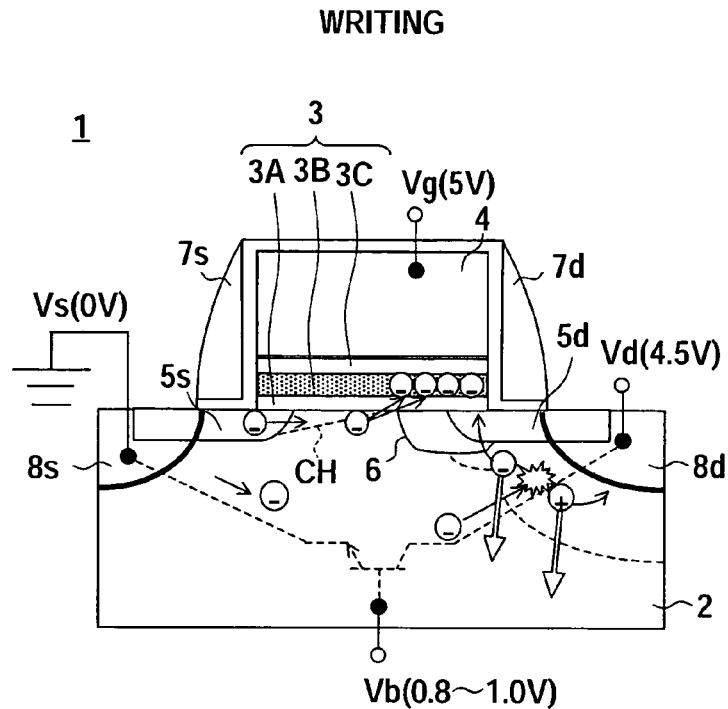
FIG. 1A is an explanatory view of an example of a writing operation using a charge injection method of the present invention.

Below, an example of setting a voltage and the operation will be explained by taking the case of the (1) above as an example. FIG. 1A is an explanatory view of a writing operation.

In a writing operation by electron injection, a source voltage Vs of the source region 8s is set to be a ground voltage (=0V or so), and, based thereon, the drain region 8d is applied with a positive drain voltage Vd and the gate electrode 4 is applied with a positive gate voltage Vg.

At this time, the body region 2 is applied with a body bias voltage Vb between the source voltage Vs and the drain voltage Vd for biasing a diode in the forward direction to turn it on at a PN junction of the source region 8s and the body region 2. At this time, the diode is biased in the inverse direction at a PN junction of the drain region 8d and the body region 2, and the depletion layer expands. Values of the drain voltage Vd and the gate voltage Vg may be any because they change in accordance with changes of the minimum size of the transistor or a power source voltage to be used, and, to cite an example, the drain voltage Vd=4.5 V and the gate voltage Vg=5 V. A voltage value of the back bias Vb may be any in a range of satisfying the above condition. While it depends on the turn-on voltage (a forward voltage Vf) of the diode on the source side, when the Vf is 0.7 to 0.8 V or so, the diode turns on with a slightly higher voltage than that as Vb=0.8 to 1.0V or so and a sufficient effect can be obtained.

Under this bias condition, in addition to a normal CHE injection operation, a bipolar operation is performed at the time.

In the CHE injection operation, electrons supplied from the source region 8s to the channel CH flow toward the drain region 8d while accelerated by electric field of lateral direction. At this time, due to the existence of the pocket region 6, convergence of the electric field of lateral direction is preferable, high-energy electrons (hot electrons) are generated near the pocket region 6, and a part thereof goes over an energy barrier made by the first oxide film 3A, etc., is shot into the stacked insulation film 3 and captured by charge traps in a region around the drain end portion of the nitride film 3B (charge storage layer).

On the other hand, in the bipolar operation, electrons are supplied from the source region 8s as an emitter to inside the body region 2, accelerated inside the body region and supplied to the depletion layer of the drain region 8d as a collector. As a result, impact ionization is brought, and consequently, pairs of high energy holes and electrons are generated. The holes generated thereby are drawn to the positive drain voltage Vd and absorbed in the drain region 8d. Further, a part of electrons generated by the impact ionization diffuses in the body region 2 due to the body bias voltage Vb, and the rest of the electrons are drawn to a relatively high positive gate voltage Vg, accelerated to obtain still higher energy and become hot electrons, go over the energy barrier made by the first oxide film 3A, etc., shot into the stacked insulation film 3, and captured by charge traps in a region around the drain end portion of the nitride film 3B (charge storage layer).

As explained above, in addition to charges by normal CHE injection, electrons caused by the bipolar operation are also injected, so that the electron injection amount per unit time increases and the injection efficiency improves. Due to the highly efficient electron injection operation, the threshold voltage of the MONOS transistor rises. In detail, when a data reading operation is performed after that, the threshold voltage after the writing of the MONOS transistor is determined by mutual canceling of electrons trapped in the stacked insulation film 3 and a positive voltage applied to the gate electrode 4 at reading. Note that the value of the threshold voltage after the writing becomes higher than that before the writing obtained by the reading operation in a state where electrons are not captured. By sensing the change of the threshold voltage by converting it to a voltage or a current, reading of data becomes possible.

The improvement of the injection efficiency by the bipolar operation will be explained quantitatively by the threshold voltage by assuming that the threshold voltage after the writing becomes 6V by the normal CHE injection not using the bipolar operation with the threshold voltage at erasing of 2V. When assuming that other voltages are the same except for applying a body bias voltage Vb, the threshold after the writing rises to 6.5V when performing the CHE injection writing using the bipolar operation in the same writing time. Accordingly, a time taken for raising the threshold voltage to 6V is shortened and writing at a high speed becomes possible. Also, when the writing time is made the same, the operation voltage can be lowered, or the duration (lifetime) of satisfying necessary charge retention characteristics and re-writing characteristics can be made long by widening an initial window width (a difference of threshold voltages between a writing state and that a erasing state) of the threshold.

Figure 1B:
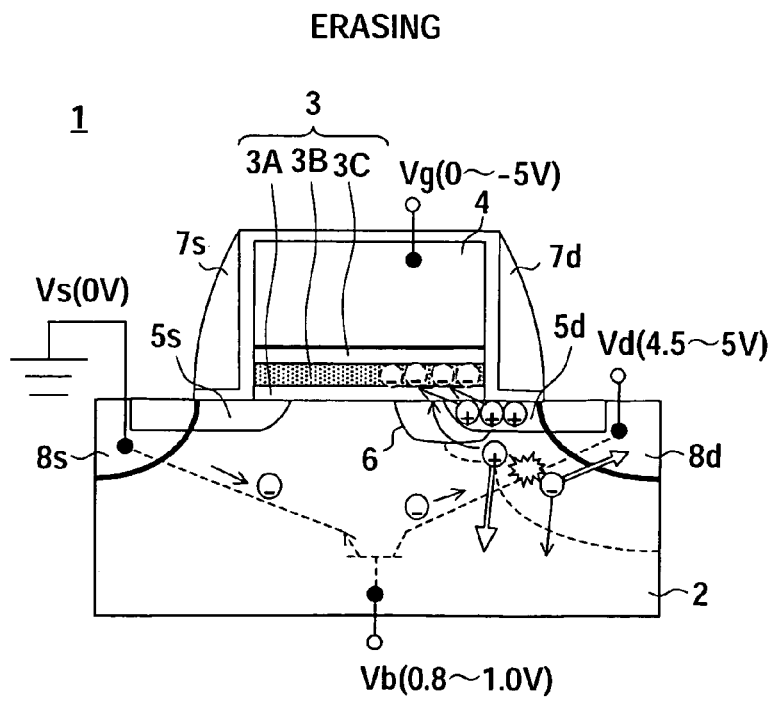
FIG. 1B is an explanatory view of an example of an erasing operation in an embodiment of the present invention.

An explanatory view of a data erasing operation by electron hole injection is shown in FIG. 1B.

In this case, in the same way as in the case of writing explained above, the source region 8s is held at the ground potential (=0V or so) and the drain region 8d is applied with a predetermined positive voltage Vd, for example, 4.5 to 5V. Then, in the same way as in writing, as a body bias voltage Vd, the body region 2 is applied with a voltage of, for example, 0.8 to 1.0V or so. The requirement to be satisfied by the voltage value is the same as that in the case of writing required for the bipolar operation. Also, as a gate voltage Vg at erasing, a voltage of 0V or a negative voltage, which is an inverse polarity of that at writing, for example, 0 to −5V, is applied to the gate electrode 4.

At this time, because the gate voltage Vg is 0V or negative, a channel is not formed and a drain voltage Vd is applied to the drain region 8d and the LDD region 5d. As a result, a hole accumulation layer is formed on the surface portion of the LDD region 8d around a lower region of the gate electrode 4 affected by the application of a negative voltage, etc., and the holes drift by an electric field of lateral direction while accelerated by an electric field of vertical direction to become high-energy charges (HH: hot holes), go over an energy barrier made by the first oxide film 3A, etc., shoot into the stacked insulation film 3 and enter into electron holding region around the drain end portion of the nitride film 3B (charge storage layer). Electrons captured at writing recombine with holes to be injected at erasing, so that the threshold value of the MONOS transistor returns back to that before the writing operation.

The bipolar operation is performed also in the erasing operation. When assuming that the gate voltage Vg is a negative voltage, holes generated by impact ionization are drawn by the gate voltage while drifting by the electric field of lateral direction, accelerated to become hot holes and injected to the electron holding region of the charge storage layer. As a result, erasing in a short time becomes possible, and when the erasing time is the same, an operation at a lower voltage becomes possible.

The hot-hole injection efficiency from the LDD region surface at the time of the erasing operation is originally lower than the CHE injection efficiency at the time of a writing operation, which results in requiring time at erasing. As explained above, pairs of holes and electrons are generated by impact ionization almost in the same way at writing and erasing, and one (electrons) of them is used for writing and the other (holes) is used for erasing. In this case, the effect of improving is larger at erasing wherein the injection efficiency is poor by the conventional method. Namely, the contribution (effect) of the bipolar operation at erasing by the application of the present invention is larger than that at writing. Actually, it is confirmed that when comparing the erasing time, the time becomes shorter at least by 7 digits when using the bipolar operation, which is an extremely large effect.

Next, a plane pattern of the MONOS transistor will be explained.

Figure 3A:
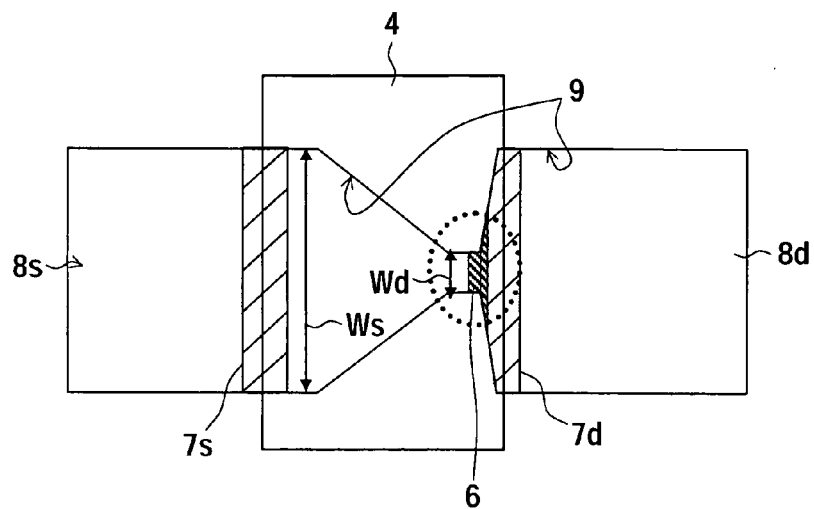
FIG. 3A is a plan view of a MONOS transistor having a pattern suitable to an embodiment of the present invention.

FIG. 3A is a plan view of the MONOS transistor having a plane pattern suitable to the present embodiment.

The characteristics of the plane pattern shown in FIG. 3A are that a plane shape of the surface side portion of the body region 2 to be a channel CH is regulated by a pattern of an element separation insulation layer 9 and becomes thin on the drain side. Namely, a channel width Wd on the drain side is narrower compared with a channel width Ws on the source side. Due to this, there are the advantages that convergence of current at CHE injection becomes high and the electron injection efficiency improves. Furthermore, since an electron holding region is limited to a part where the channel width Wd is narrow on the drain side, an injection charge amount necessary for obtaining the same threshold change is small, which is efficient. This point gives another advantage because a region for injecting holes at erasing is limited. Namely, an area of the LDD region 7d where holes are accumulated is small, and the electric field converges to that part, so that the injection efficiency-improves.

Furthermore, positions of impact ionization of the parasitic bipolar transistor at writing and erasing gather to the narrow part on the drain side. Namely, there is an effect of narrowing a current path of the parasitic bipolar transistor, which is efficient.

Figure 3B:
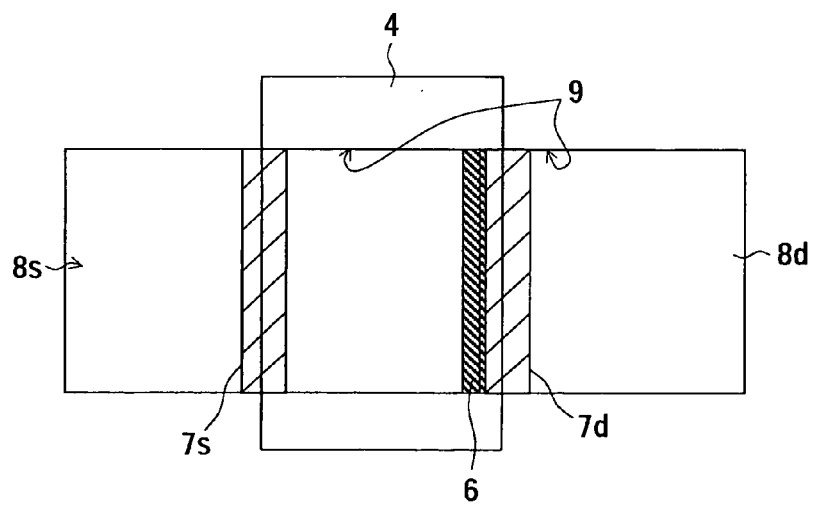
FIG. 3B is a plan view of a MONOS transistor having another applicable pattern.

Note that a channel resistance value becomes high when the current path is narrowed. When this adversely affects, as shown in FIG. 3B, a normal plane pattern may be used wherein channel widths are the same on the source side and the drain side.

Figure 4A:
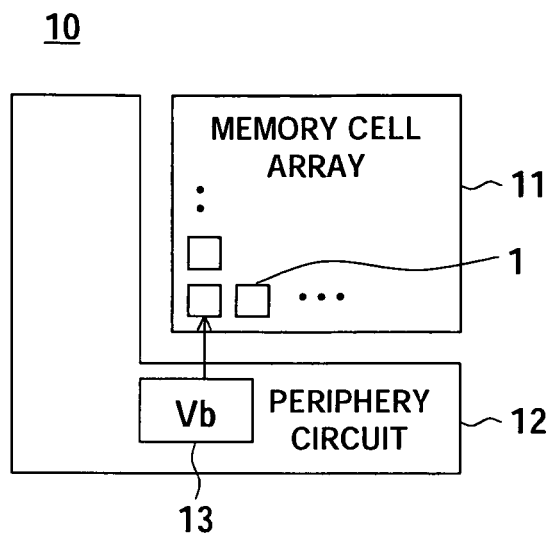
FIG. 4A is a view of the simplified overall configuration of a nonvolatile memory device according to an embodiment of the present invention.

FIG. 4A is a simplified overall configuration of a nonvolatile memory device according to the present embodiment. The nonvolatile memory device 10 in FIG. 4A comprises a memory cell array 11, wherein a large number of MONOS transistors 1 configured as above are arranged. While not particularly illustrated, the memory cell array 11 is configured to have wirings arranged in the line and column directions to supply voltages to the MONOS transistors 1. Around the memory cell array 11, a periphery circuit 12 for controlling writing, erasing and reading of the memory cell array is provided. In FIG. 4A, a voltage supply circuit 13 is shown in the periphery circuit 12. The voltage supply circuit 13 is configured to be capable of generating and supplying a body bias voltage Vb, which is a characteristic of the present invention. Note that the voltage supply circuit 13 may be used in common with a circuit for generating other voltage (a drain voltage Vd, etc.) or provided separately from the circuit.

FIG. 4A shows the case where the nonvolatile semiconductor memory device according to the present embodiment has a function of generating a body bias voltage therein. But the function may be provided outside of the nonvolatile semiconductor memory device. Note that, also in that case, the nonvolatile semiconductor memory device keeps good contact with the body region so as to be capable of applying the body bias voltage and is required to have the configuration that the potential can be controlled from outside via wiring and a lead terminal.

Figure 4B:
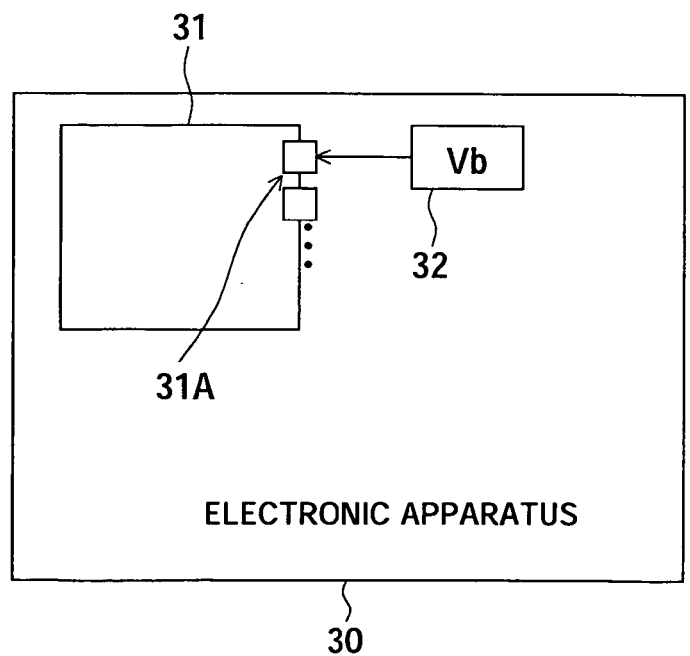
FIG. 4B is a view of the simplified configuration of an electronic apparatus according to the embodiment of the present invention.
Figure 5A:
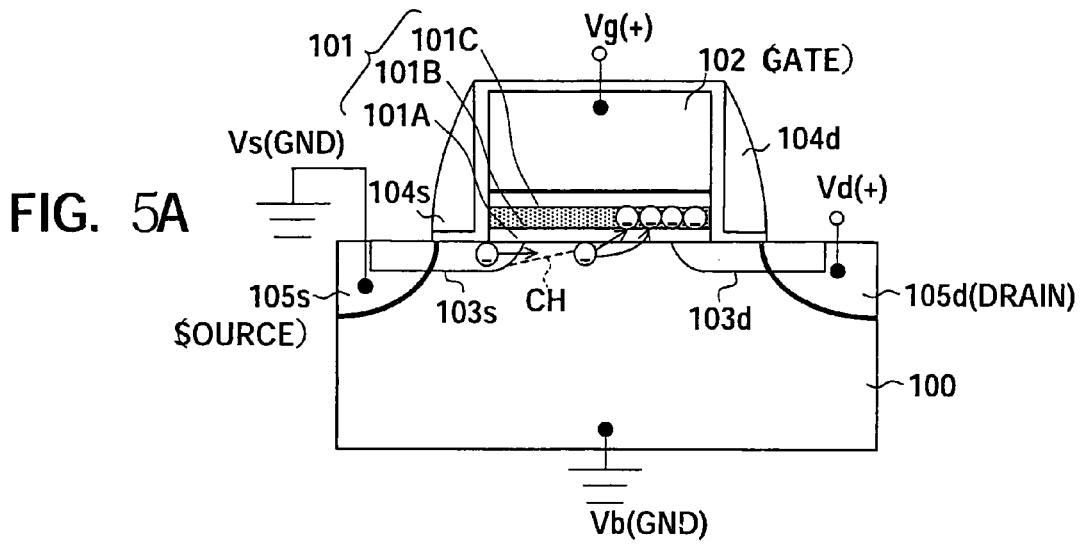
FIG. 5A is an explanatory view of an operation of injecting CHE under a bias condition of the related art.
Figure 5B:
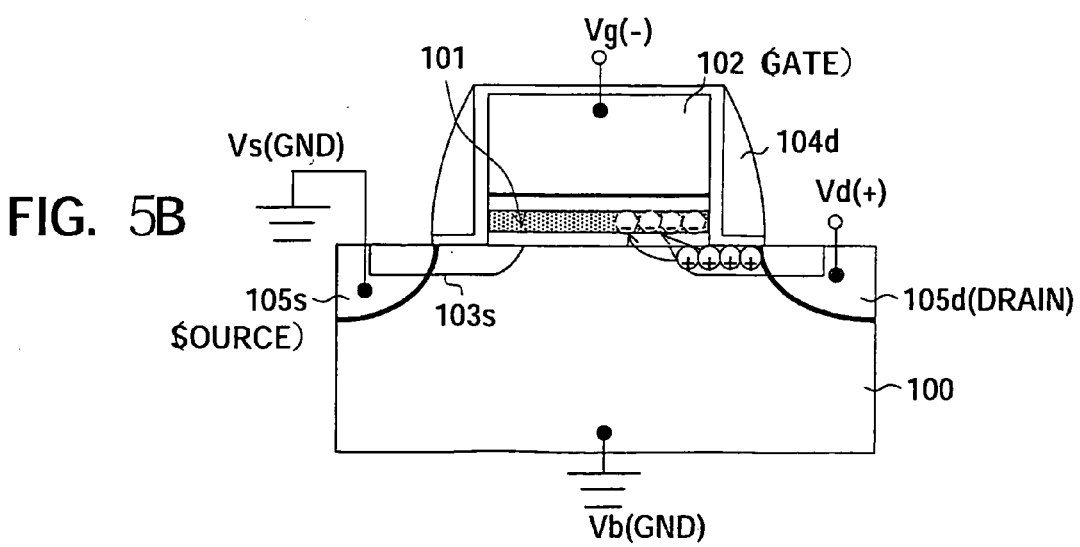
FIG. 5B is an explanatory view of an operation of injecting hot holes from a drain end under a bias condition of the related art.

FIG. 4B is a view of an embodiment of an electronic apparatus of the present invention.

The electric device 30 does not have a function of generating a body bias voltage Vb, but it comprises therein a nonvolatile memory device 31 provided with an external terminal 31A for substrate bias fixing, etc. and a voltage supply circuit 32 for supplying a body bias voltage Vb to the external terminal 31A.

From the above, even in the case where only a nonvolatile memory not provided with a body bias voltage generating function is available, it is possible to apply the body bias voltage Vb by using the external terminal 31A for substrate bias fixing, etc.

Note that since the body bias voltage Vb to be applied to the body region has a voltage value between the source voltage Vs and the drain voltage Vd, it can be generated by level shift of an existing voltage, etc. and an increase of a load on the voltage generation circuit is not caused. This can be applied to either of the voltage supply circuit 13 incorporated in the memory shown in FIG. 4A and the voltage supply circuit 32 provided outside the memory shown in FIG. 4B.

Also, there is an advantage that a high-voltage resistance transistor is not necessary for the voltage supply circuit 13 of a type to be built in a memory. This means an increase of the number of photomasks and number of procedure steps is not caused by applying a back bias. Accordingly, in the present embodiment, various advantages, such as a reduction of the operation time, attaining a low voltage or a long lifetime as explained above, can be obtained by applying a body bias voltage without any cost disadvantages.

The embodiments explained above are for easier understanding of the present invention and not to limit the present invention. Accordingly, respective elements disclosed in the above embodiments include all modifications in designs and equivalents belonging to the technical field of the present invention.

What is claimed is:

1. A charge injection method of a nonvolatile semiconductor memory device, for changing a data storage status by injecting charges to a charge storage layer of a memory transistor comprising a body region of a first conductive type formed in a semiconductor substrate or formed as a semiconductor layer supported by a base body, a source region and a drain region made by a second conductive type semiconductor regions formed to be distant from each other in the body region, a stacked insulation film formed on the body region and including a charge storage layer, and a gate electrode formed on the stacked insulation film for controlling electric fields of the charge storage layer and the body region, comprising, when injecting the charges to the charge storage layer, the steps of:
applying different voltages to the source region and the drain region;
applying a voltage between the different voltages respectively applied to the source region and the drain region to the body region for turning on a diode formed by the source region of a second conductive type and the body region of a first conductive type; and
applying a voltage having a polarity in accordance with charges to be injected to the gate electrode.

2. The charge injection method of a nonvolatile semiconductor memory device as set forth in claim 1, comprising, when injecting holes to the charge storage layer, the steps of:
applying a positive voltage to one of the source region and the drain region by using the other as a reference;
applying a lower positive voltage than the positive voltage to the body region; and
applying a negative voltage to the gate electrode.

3. The charge injection method of a nonvolatile semiconductor memory device as set forth in claim 1, comprising, when injecting electrons to the charge storage layer, the steps of:
applying a positive voltage to one of the source region and the drain region by using the other as a reference;

applying a lower positive voltage than the positive voltage to the body region; and applying a positive voltage to the gate electrode.

4. A nonvolatile semiconductor memory device, comprising a memory transistor provided with a body region of a first conductive type formed in a semiconductor substrate or formed as a semiconductor layer supported by a base body, a source region and a drain region made by second conductive-type semiconductor regions formed to be distant from each other in the body region, a stacked insulation film formed on the body region and including a charge storage layer, and a gate electrode formed on the stacked insulation film for controlling electric fields of the charge storage layer and the body region, and the nonvolatile semiconductor memory device having a periphery circuit for controlling a data storing operation of the memory transistor by changing a charge storage state of the charge storage layer, wherein, among voltages generated by the periphery circuit, different voltages are applied to the source region and the drain region, and a voltage supplied to the body region when injecting charges to the charge storage layer by applying a gate voltage to the gate electrode is set to a voltage between a source voltage to be supplied to the source region and a drain voltage to be supplied to the drain region for turning on a diode formed by the source region of a second conductive type and the body region of a first conductive type.

5. The nonvolatile semiconductor memory device as set forth in claim 4, wherein a plane shape of a surface side portion of the body region is set, so that a current path flowing in the body region when different voltages are supplied to the source region and the drain region becomes narrow on the drain region side.

6. The nonvolatile semiconductor memory device as set forth in claim 4, wherein the stacked insulation film comprises:
a first insulation film on the body region side;
a second insulation film on the gate electrode side; and
a charge storage layer formed between the first and second insulation films and made by an insulation film having a higher charge trap density than those of the first and second insulation films.

7. An electronic apparatus mounted with a nonvolatile semiconductor memory device, wherein the nonvolatile memory device comprises:
a body region of a first conductive type formed in a semiconductor substrate or formed as a semiconductor layer supported by a base body;
a source region and a drain region made by second conductive type semiconductor regions formed to be distant from each other in the body region;
a stacked insulation film formed on the body region and including a charge storage layer; and
a gate electrode formed on the stacked insulation film for controlling electric fields of the charge storage layer and the body region, wherein a voltage supply circuit for generating voltages to be applied respectively to the body region, the source region, the drain region and the gate electrode, and supplying the generated voltages to the nonvolatile semiconductor memory device when injecting charges to the charge storage layer is provided in the electronic apparatus, and the voltage to be supplied to the body region is set to a voltage between a source voltage to be supplied to the source region and a drain voltage to be supplied to the drain region for turning on a diode formed by the source region of a second conductive type and the body region of a first conductive type.

8. The electronic apparatus as set forth in claim 7, wherein a plane shape of a surface side portion of the body region is set, so that a current path flowing in the body region when different voltages are supplied to the source region and the drain region becomes narrow on the drain region side.

9. The electronic apparatus as set forth in claim 7, wherein the stacked insulation film comprises:
a first insulation film on the body region side;
a second insulation film on the gate electrode side; and
a charge storage layer formed between the first and second insulation films and made by an insulation film having a higher charge trap density than those of the first and second insulation films.

* * * * *